United States Patent
Jones et al.

[19]

[11] Patent Number: 6,069,443
[45] Date of Patent: May 30, 2000

[54] PASSIVE MATRIX OLED DISPLAY

[75] Inventors: Gary W. Jones, Lagrangeville; Amalkumar P. Ghosh, Poughkeepsie, both of N.Y.

[73] Assignee: FED Corporation, Hopewell Junction, N.Y.

[21] Appl. No.: 09/042,154

[22] Filed: Mar. 13, 1998

Related U.S. Application Data

[60] Provisional application No. 60/050,474, Jun. 23, 1997.

[51] Int. Cl.⁷ .................................................. H05B 33/22
[52] U.S. Cl. .......................... 313/504; 313/506; 313/509
[58] Field of Search .................................. 313/499, 500, 313/504, 506, 509, 512; 427/66; 428/917

[56] References Cited

U.S. PATENT DOCUMENTS

| | | | |
|---|---|---|---|
| 4,736,229 | 4/1988 | Holmberg et al. | 357/4 |
| 5,123,847 | 6/1992 | Holmberg et al. | 437/48 |
| 5,329,207 | 7/1994 | Cathey et al. | 315/169.1 |
| 5,438,240 | 8/1995 | Cathey et al. | 315/169.1 |
| 5,445,899 | 8/1995 | Budzilek et al. | 313/506 |
| 5,578,902 | 11/1996 | Vickers | 313/496 |
| 5,583,349 | 12/1996 | Norman et al. | 257/88 |
| 5,598,057 | 1/1997 | Vickers | 313/495 |
| 5,701,055 | 12/1997 | Nagayama et al. | 313/506 |
| 5,736,754 | 4/1998 | Shi et al. | 313/509 |
| 5,773,931 | 6/1998 | Shi et al. | 313/509 |
| 5,804,917 | 9/1998 | Takahashi et al. | 313/500 |
| 5,811,177 | 9/1998 | Shi et al. | 313/506 |
| 5,814,935 | 9/1998 | Ujihara | 313/504 |

*Primary Examiner*—Michael Day
*Attorney, Agent, or Firm*—Collier, Shannon, Rill & Scott, PLLC

[57] ABSTRACT

The present invention is directed to an organic light emitting device having a substrate, and at least one conductor formed on the substrate. A first insulator layer is formed on the at least one conductor and the substrate. The insulator layer includes at least one pixel opening formed therein defining a pixel area. A second insulator layer is formed on the first insulator layer. The organic light emitting device also include an OLED layer formed on the at least one conductor in the pixel area. The organic light emitting device may further include a sealing structure formed over the OLED layer. The sealing structure includes at least one material formed over the OLED layer. The first insulator layer and the sealing structure form a protective barrier around the OLED layer. The first insulator layer includes a uniformly sloping surface surrounding the pixel area. The OLED layer preferably extends over the uniformly sloping surface. The organic light emitting may further include at least one OLED connector pad formed on the substrate. Methods of forming the pixel area and the organic light emitting devices are also disclosed.

38 Claims, 8 Drawing Sheets

PASSIVE MATRIX OLED DISPLAY

This application relates to and claims priority on U.S. Provisional Application Ser. No. 60/050,474, filed on Jun. 23, 1997.

FIELD OF THE INVENTION

This invention relates to organic light emitting devices. More specifically, this invention relates to an improved structure and method for producing passive matrix organic light emitting display devices.

BACKGROUND OF THE INVENTION

Light emitting devices, which may be generally classified as organic or inorganic, are well known in the graphic display and imaging art. Among the benefits of organic light emitting devices are high visibility due to self-emission, as well as superior impact resistance, and ease of handling of the solid state devices. Organic light emitting display devices may have practical application for television and graphic displays, as well as in digital printing applications.

An organic light emitting display device is typically a laminate formed on a substrate such as soda-lime glass. A light-emitting layer of a luminescent organic solid, as well as adjacent semiconductor layers, are sandwiched between a cathode and an anode. The semiconductor layers may be hole-injecting and electron-injecting layers. The light-emitting layer may be selected from any of a multitude of light emitting organic solids. The light-emitting layer may consist of multiple sublayers.

When a potential difference is applied across the cathode and anode, electrons from the electron-injecting layer, and holes from the hole-injecting layer are injected into the light-emitting layer. They recombine, emitting light.

In a typical matrix-addressed organic light emitting display device, numerous light emitting devices are formed on a single substrate and arranged in groups in a regular grid pattern. Several light emitting device groups forming a column of the grid may share a common cathode, or cathode line. Several light emitting device groups forming a row of the grid may share a common anode, or anode line. The individual light emitting devices in a given group emit light when their cathode and anode are activated at the same time. Activation may be by rows and columns or in an active matrix with individual cathode and anode pads.

Organic light emitting devices have a number of beneficial characteristics. These include a low activation voltage (about to 4.5 volts), fast response when formed with a thin light-emitting layer, and high brightness in proportion to the injected electric current. By changing the kinds of organic solids making up the light-emitting layer, many different colors of light may be emitted, ranging from visible blue, to green, yellow, and red. Organic light emitting devices are currently the subject of aggressive investigative efforts.

Organic light emitting devices need to be protected from the atmosphere. The light emitting organic material in the light-emitting layer can be highly reactive. The material is susceptible to water, oxygen, etc. Moisture and oxygen may cause a reduction in the useful life of the light emitting device. The cathode and anode may also be affected by oxidation.

One disadvantage of oxygen and moisture penetration into the interior of the organic light emitting device is the potential to form metal oxides at the metal-organic interface. These metal oxide impurities may allow separation of the cathode or anode and the organic in a matrix addressed OLED, especially the oxidation sensitive cathode, such as, Mg+Ag or Al+Li. This can result in the formation of dark non-emitting spots (i.e., no illumination) because no current flows through the area of the separation.

Edge shorting between the cathode and anode layers is a current problem affecting most conventional organic light emitting display devices. This edge shorting reduces the illuminating potential of the display devices.

Exposing a conventional light emitting device to the atmosphere, shortens its life. To obtain a practical, useable organic light emitting device, it is necessary to protect the device, so that water, oxygen, etc., do not infiltrate the light-emitting layer.

Methods commonly employed for protecting or sealing inorganic light emitting devices are typically not effective for sealing organic light emitting devices. Resin coatings that have been used to protect inorganic light emitting devices are not suited for organic light emitting devices. The solvent used in the resin coating solution tends to infiltrate the light-emitting layer, degrading the light emission properties of the device. It alters the organic light-emitting layer, reducing or eliminating its light emission properties.

OBJECTS OF THE INVENTION

It is an object of the present invention to provide an organic light emitting display device with an isolation structure to minimize edge shorts between the OLED layer and the electrode elements.

It is another object of the present invention to minimize separation of layers within the light emitting display device.

It is another object of the present invention to provide a structure that provides a method to pattern lines of OLED material and conductor without subsequent processing.

It is another object of the present invention to minimize shorts and leakage between the top and bottom conductors on either side of the OLED.

It is another object of the present invention to provide an insulator layer to minimize fringe effects and leakage between the top and bottom conductors on either side of the OLED layer.

It is another object of the present invention to provide an insulator layer to minimize edge shorts between lines by separating the OLED layer and the electrode elements.

It is another object of the present invention to provide an insulator layer having uniformly sloping surfaces that define a pixel area to localize emission from the OLED device, which minimizes fringe effects and leakage between the top and bottom conductors on either side of the OLED structure.

It is another object of the present invention to provide a sealing structure to isolate the OLED layer from moisture and other contaminants.

It is another object of the present invention to provide a sealing structure in combination with an insulator layer to encapsulate the OLED layer to minimize shorting and exposure to moisture.

It is another object to the present invention to provide a novel method of forming pixel areas having uniformly sloped surfaces to localize emission and minimize edge shorting.

It is another object of the present invention to form OLED layer connector elements with electrode elements to minimize additional processing after the OLED layer is deposited.

It is another object of the present invention to provide conductor strips on the electrode elements to improve conductivity.

SUMMARY OF THE INVENTION

The present invention is directed to an organic light emitting display device having a substrate, and at least one conductor formed on the substrate. A first insulator layer is formed on the at least one conductor and the substrate. The insulator layer includes at least one pixel opening formed therein defining a pixel area. A second insulator layer is formed on the first insulator layer. The organic light emitting display device also includes an OLED layer formed on the at least one conductor in the pixel area.

The organic light emitting display device may further include a sealing structure deposited over the OLED layer. The sealing structure includes at least one material deposited over the OLED layer. The first insulator layer and the sealing structure form a protective barrier around the OLED layer.

In a preferred embodiment of the present invention, the first insulator layer includes a uniformly sloping surface surrounding the pixel area. The OLED layer preferably extends over the uniformly sloping surface.

The organic light emitting display may further include at least one OLED electrode pad formed on the substrate. The at least one OLED electrode pad is capable of being electrically connected to the OLED layer. Furthermore, the at least one OLED electrode pad is orthogonal to the at least one conductor.

The present invention is also directed to an organic light emitting display device having a substrate, at least one conductor formed on the substrate, and at least one OLED electrode pad formed on the substrate. An insulator layer is formed on the at least one conductor and the substrate. An OLED layer is formed on the at least one conductor in a pixel area. The at least one OLED electrode pad is capable of being electrically connected to the OLED layer.

The insulator layer in the organic light emitting display device further includes a first insulator layer formed on the at least one conductor and the substrate. The first insulator layer includes at least one pixel opening formed therein defining the pixel area. The first insulator layer includes a uniformly sloping surface surrounding the pixel area, wherein the OLED layer extends over the uniformly sloping surface. The insulator layer also includes a second insulator layer formed on the first insulator layer. The present invention is also directed to a sealing structure deposited over the OLED layer.

BRIEF DESCRIPTION OF THE DRAWINGS

The present invention will now be described in connection with the following figures in which like reference numerals refer to like elements and wherein.

DETAILED DESCRIPTION OF THE PREFERRED EMBODIMENTS

The present invention is directed to an improved light emitting device that includes an organic light emitting device (OLED). The OLED 1 preferably includes an array of light emitting pixels. The OLED 1 may comprise a plurality of rows of individual pixels. Alternatively, the individual pixels 10 may be arranged in a line array.

Figure 1:
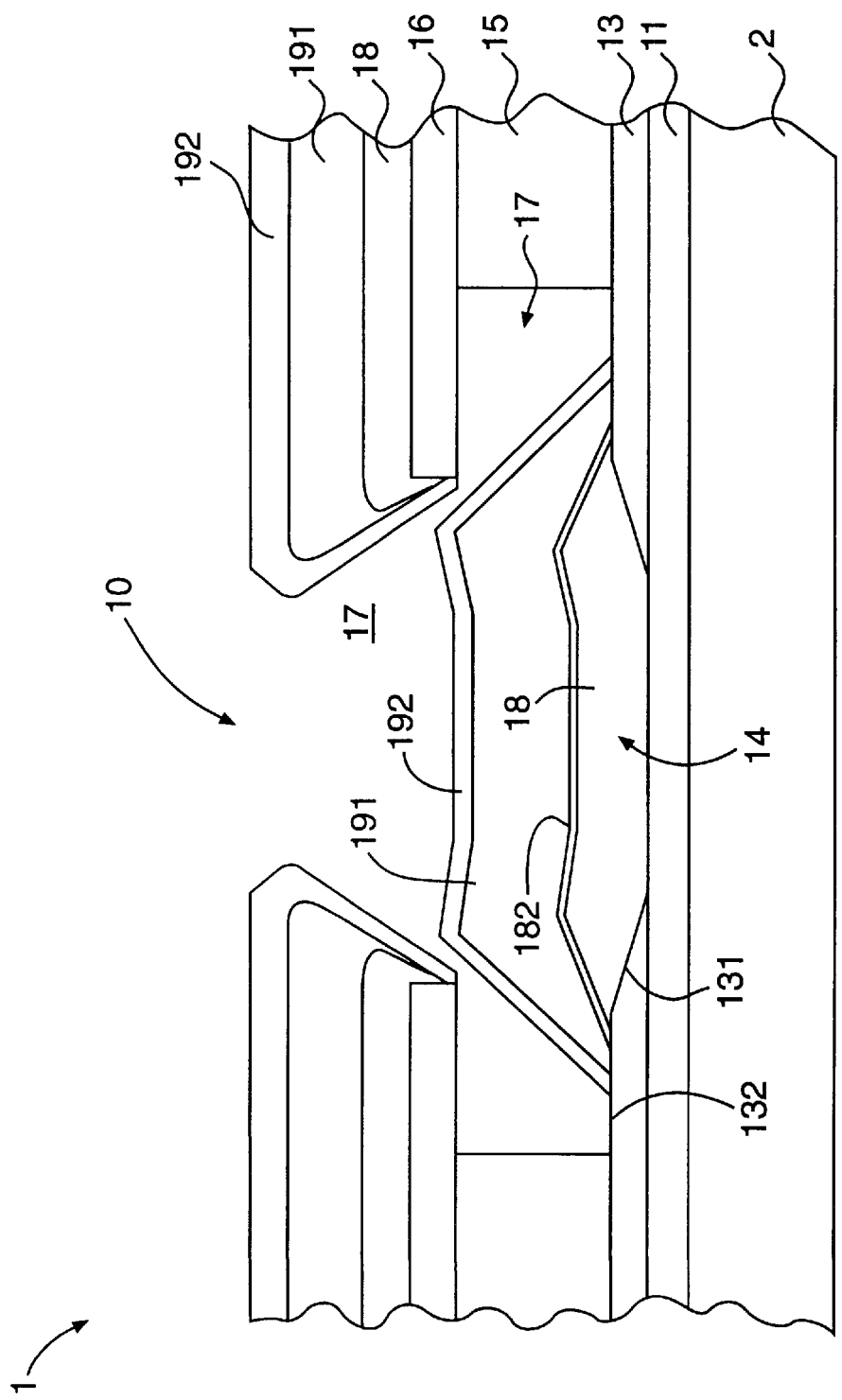
FIG. 1 is a side view of an organic light emitting device according to an embodiment of the present invention.

A preferred embodiment of the present invention will now be described in connection with a single light emitting pixel 10, as shown in FIG. 1. The OLED 1 is formed on a substrate 2. The substrate 2 is preferably an electrically insulating substrate. The substrate 2 may be formed from a borosilicate glass, silicon on quartz or other suitable substrate material.

An electrode layer is formed on the substrate 2. The electrode layer preferably consists of a plurality of light transmissive electrode elements 11. The electrode elements 11 are preferably formed as lines directly on the substrate 2 using conventional techniques. The electrode elements 11 may be screen coated or lithographically patterned using conventional photoresist and etching techniques. In a preferred embodiment, the electrode elements 11 have sloped edges.

The electrode elements 11 are preferably formed from a mixture of indium oxide and tin oxide or indium tin oxide (ITO). However, it is contemplated that other suitable light transmissive electrically conductive materials may be used to construct the electrode elements including but not limited to zinc oxide in indium oxide. The electrode elements 11 preferably have an approximate thickness of 150 nm. The inventors of the present invention contemplate that other thicknesses (e.g., 50 nm to 250 nm) are acceptable and considered to be within the scope of the present invention. Increased thicknesses are contemplated, however, as the thickness of the layer increases, it becomes less light transmissive.

Figure 2:
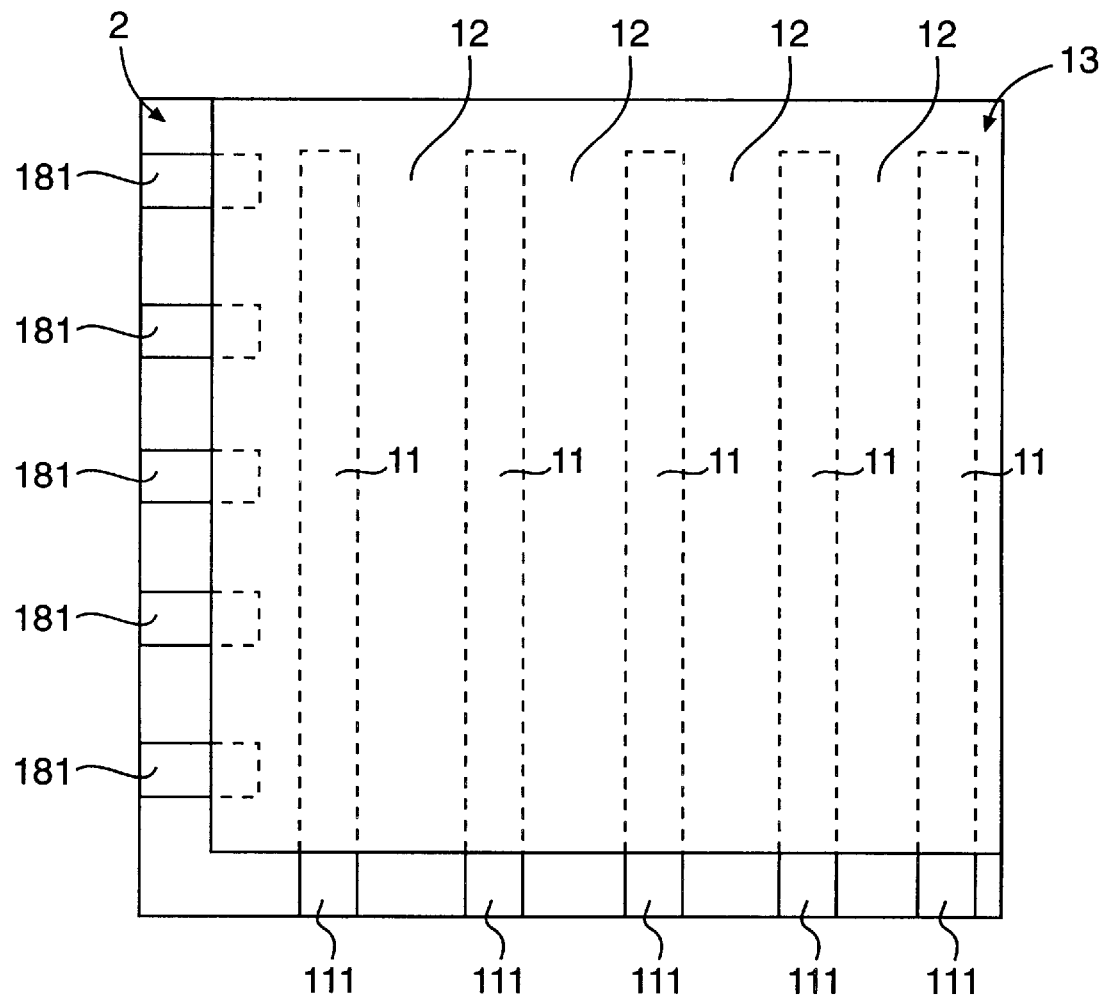
FIG. 2 is top plan view of the substrate, first electrode elements, and OLED connector pads of the organic light emitting device according to the present invention.

After the electrode elements 11 are deposited on the substrate 2, the OLED connector pads 181 and electrode end portions 111 are deposited on the edge of the substrate 2, as shown in FIG. 2. The OLED connector pads 181 and electrode end portions 111 are preferably formed from chrome for enhanced electrical conductivity. The OLED connector pads 181 serve as electrical connectors for the top electrode layer 182 of the OLED layer 18, described below. With this arrangement, electrical connections can be made without the need of additional structures and further processing after OLED formation.

Figure 3:
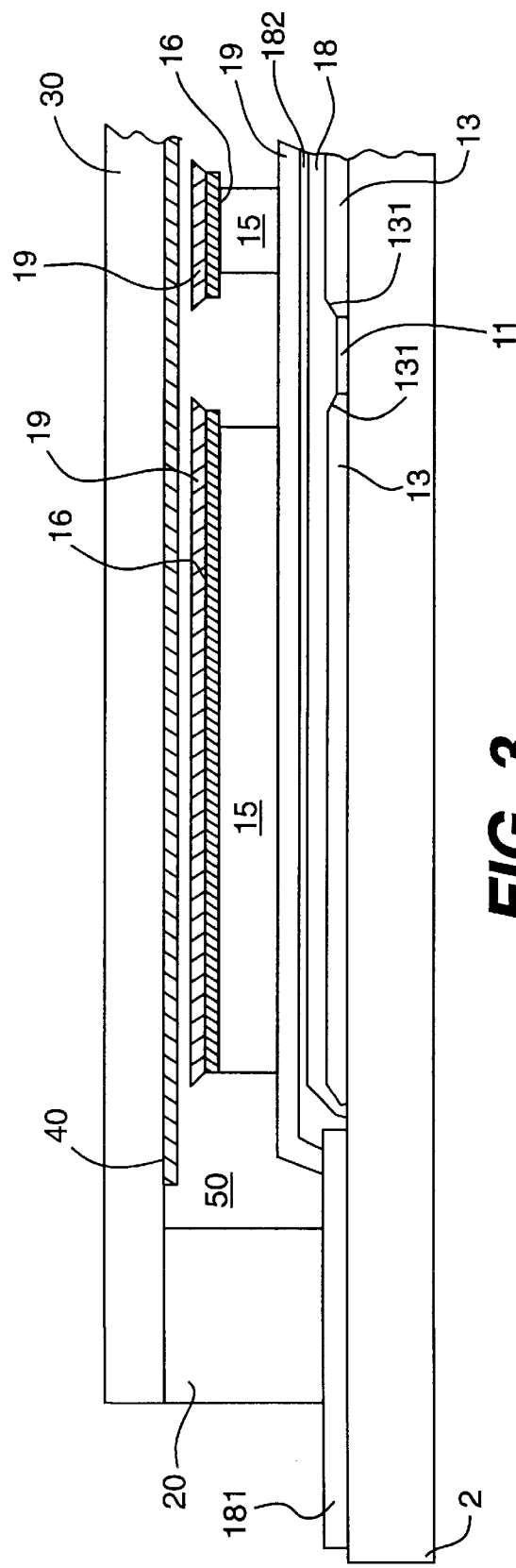
FIG. 3 is a side view of the connection between an OLED layer and an OLED connector pad according to the present invention.

Alternatively, the mask used to pattern the electrode elements 11 on the substrate 2 also permits patterning of the OLED connector pads 181. Accordingly, the electrode elements 11 and OLED connector pads 181 can be formed during the same processing operation. The OLED connector pads 181 permit the top electrode layer 182 of the OLED layer 18 to be connected with minimal post OLED layer deposition processing, as shown in FIG. 3.

A first insulator layer 13 is formed above the electrode elements 11. The first insulator layer 13 also fills the spaces 12, shown in FIG. 2, between the electrode elements 11. The first insulator layer 13 is preferably formed from SiO. However, it is contemplated that other dielectric materials such as, for example, aluminum oxide, silicon nitride or diamond like carbon films (DLC) may be used to form the first insulator layer 13 and are within the scope of the present invention. The first insulator layer 13 preferably has a thickness in the range of 4 KA (kilo angstroms). The first insulator layer 13 includes one or more pixel areas 14 formed therein. The pixel areas 14 are aligned on the electrode elements 11. The pixel areas 14 formed in the first insulator layer 13 serve to better define the pixel shape. The first insulator layer 13 is located over the entire substrate 2 except in the pixel areas 14 and the OLED connector pads 181. The pixel areas 14 are defined by uniformly sloping surfaces 131 of the first insulator layer 13. The process of forming the pixel areas 14 will be described in detail below.

The first insulator layer 13 provides a barrier between the electrode elements 11 and the top electrode layer 182 of the OLED layer 18. This arrangement serves to localize the light emission in the pixel areas 14. Additionally, this arrangement serves to minimize the probability of edge shorting between the electrode elements 11 (e.g., ITO) and the top electrode layer 182 of OLED layer 18 outside the pixel area 14. Thus, the potential yield is improved.

A first insulator layer 13 that comprises multiple layers is contemplated to be within the scope of the present invention. For example, a bilayer may comprise a SiO layer that is coated with a diamond like carbon ("DLC") layer. The bilayer further reduces pinhole etching and shorting risks. Furthermore, the bilayer creates a better isolation wall profile. This is desirable but can be omitted provide the ITO edges are isolated.

A second insulator layer 15 is formed on top of the first insulator layer 13. The second insulator layer 15 is preferably formed from a differentially etchable material (e.g., $SiO_2$ or DLC) relative to the first insulator 13 and top electrode layer 182. The top electrode layer 182 is preferably a transport conductor. It is contemplated that other suitable etchable insulator materials may be used to form the second insulator layer 15. The second insulator layer 15 may be deposited by chemical vapor deposition (CVD), evaporation or sputtering. The second insulator layer 15 preferably has an approximate thickness of 2 microns. The inventors of the present invention contemplate that other thicknesses (e.g., 0.2 to 20 microns) are acceptable and considered to be within the scope of the present invention.

An overlying layer 16 is deposited on top of the second insulator layer 15 by, for example, a screening process. The overlying layer 16 is preferably formed from SiO having a thickness of approximately 4–10 KA. However, other materials (e.g., $Al_2O_3$ or SiC) and thicknesses (e.g., 500 A to 5 microns) are contemplated to be within the scope of the present invention. Increased thicknesses are also contemplated (e.g., 200 microns or larger).

A portion of the overlying layer 16 is removed above the pixel area 14. A portion of the second insulator layer 15 is removed above the pixel area 14. The portion of the overlying layer 16 and part of the second insulator layer 15 are removed by a first etching process. The first etching process preferably employs a reactive ion etch (RIE) in CF4 and oxygen (many RIE chemistries may be used that are available to those skilled in the art). This removes the desired portion of the overlying layer 16 creating an opening 162 and part of the second insulator layer 15, which forms an overhang portion 161. The opening 162 is larger than the pixel area 14 to permit overlap of the OLED layer 18 with the first insulator layer 13. It is important that this first etching does not remove all of the second insulator layer 15 to expose the first insulator layer 13. Thus, preventing removal of the first insulator layer 13. The remaining portion of the second insulator layer 15 is removed during a second etching process. The second etching process permits removal of the second insulator layer 15 without removing any of the overlying layer 16 and the first insulator layer 13. The second etching process preferably employs a buffered oxide etch (BOE) (10% HF and ammonium bifloride solution). Other etching processes are considered to be within the scope of the present invention that are capable of forming a recess channel 17 by removing portions of the overlying layer 16 and the second insulator layer 15 without removing the first insulator layer. For example, when DLC is used as an insulator, oxygen plasma may be used to undercut the top overlying layer 16. A recess channel 17 is formed above each pixel area 14 formed in the first insulator layer 13. The channel 17 extends along a row of pixel area 14.

The OLED layer 18 is then deposited within the channel 17 covering the pixel area 14, as shown in FIG. 1. The OLED layer 18 comprises one or more layers. The OLED layer 18 extends up a portion of the uniformly sloping surfaces 131 and over a portion of a protective ledge 132. The protective ledge 132 comprises the exposed upper surface of the first insulator layer 13.

Each OLED layer 18 is connected to a corresponding OLED connector pads 181 on substrate 2 by top electrode layer 182, as shown in FIG. 3.

A passivation layer 19 is then applied over the OLED layer 18 to provide a low pinhole density moisture barrier. The passivation layer 19 in connection with the first insulator layer 13 and electrode element 11 encapsulates the OLED layer 18 to isolate the OLED layer 18 such that the OLED layer 18 only contacts the electrode element 11 in the pixel area 14. This minimizes the possibility of moisture penetration and subsequent separation of the layers. The passivation layer 19 preferably includes multiple layers. One example of the passivation layer is a 19 is illustrated in FIG. 1 and includes a first passivation layer 191 and a second passivation layer 192. The first passivation layer 191 is deposited on top of the OLED layer 18 and extends over a portion of the protective ledge 132. The first passivation layer 191 is preferably formed from a material having low pinhole densities (e.g., Mg and Ag alloys or Al and Cu and Ti alloys, DLC, graphite, ITO, SiC, PECVDC, etc.)

The second passivation layer 192 is deposited on top of the first passivation layer 191. The second passivation layer 192 is preferably formed from diamond like carbon films (DLC) or plasma enhanced chemical vapor deposition (PECVD) deposited insulators such as $Si_3O_4$ and $SiO_2$. However, it is contemplated that the second passivation layer 192 is not limited to the specific materials disclosed. Rather, other materials having low pinhole densities are contemplated to be within the scope of the present invention.

Although a passivation layer 19 containing first and second passivation layers 191 and 192 is presently preferred by the inventors, it is contemplated that a single passivation layer may be used in accordance with the present invention. Additionally, it is also contemplated that more than two passivation layers may be used in accordance with the present invention. Additional passivation layers may be used to reduce pinhole density and defects.

Additionally, the passivation layers 191 and 192 extend over a portion of connector pads 182, as shown in FIG. 3.

The passivation layers 191 and 192 provide a barrier to prevent moisture penetration between the connector pad 182 and the top electrode layer 182.

The OLED layer 18 and the first and second passivation layers 191 and 192 are preferably evaporatively deposited through the use of a shadow mask onto the display. This avoids deposition of the OLED layer 18 on the substrate 2 in the areas where the end portion 111 of the electrode elements 11 are located.

The process of depositing the first insulator layer 13 and forming the pixel areas 14 will now be described according to a preferred embodiment of the present invention.

Figure 4:
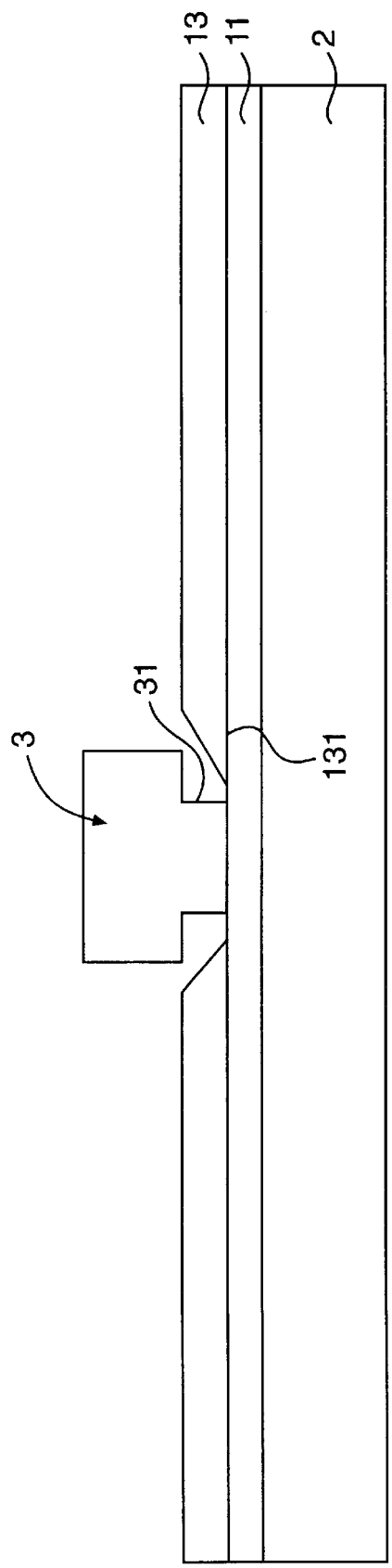
FIG. 4 is a side view illustrating the process of depositing the first insulator layer according to an embodiment of the present invention.

After electrode elements 11 are defined on the substrate 2, a liftoff process is used to deposit the first insulator layer 13 on the substrate 2 everywhere except in the pixel areas 14 and the OLED connector pads 181 and end portions 111 of electrode elements 11 where electrical connection will be made. The process of depositing the first insulator layer 13 utilizes a resist plug 3, as shown in FIG. 4. The lift off layer resist plug 3 is preferably the size of the pixel. The material forming the first insulator layer 13 is evaporation deposited at an angle with respect to the substrate 2. If a layer 16 having a thickness greater than 1 micron is desired and at least a 15% evaporation deposition angle is used, then the uniformly sloped surfaces 131 can be obtained. The uniformly sloped surfaces 131 minimize the step coverable problems at the pixel edge. Furthermore, the uniformly sloped surfaces 131 provide protection against shorting of the edge of the electrode elements 11. This reduces the probability of pixel edge exposure and shorting. Furthermore, this process better defines the pixel shape. Additionally, this process allows the formation of a sloped edge adjacent the pixel area, as shown in FIG. 1. This sloped edge can be reliably and uniformly reproduced in adjacent pixel areas.

The resist plug 3 includes an undercut layer 31, as shown in FIG. 4, such as a developer soluble antireflective coating. The coating is a commercially available material from Brewer Scientific. Alternatively, a photoresist process that provides such as an undercut naturally as part of the process such as JSR novalac resin based negative photoresist (e.g., 5 micron thickness).

Alternatively, it is possible to form the pixel areas 14 by screen coating a pattern over a partially soluble liftoff layer. This method is preferable for larger size pixels.

Another embodiment of the present invention will be described in connection with FIG. 5. The OLED 1 preferably includes an array of light emitting pixels. The OLED 1 is formed on a substrate 2.

A electrode layer as described above is formed on the substrate 2. The electrode layer preferably consists of a plurality of light transmissive electrode elements 11. The electrode elements 11 are preferably formed as lines directly on the substrate 2 using conventional techniques.

The electrode elements 11 are preferably formed from a mixture of indium oxide and tin oxide or indium tin oxide (ITO).

Figure 5:
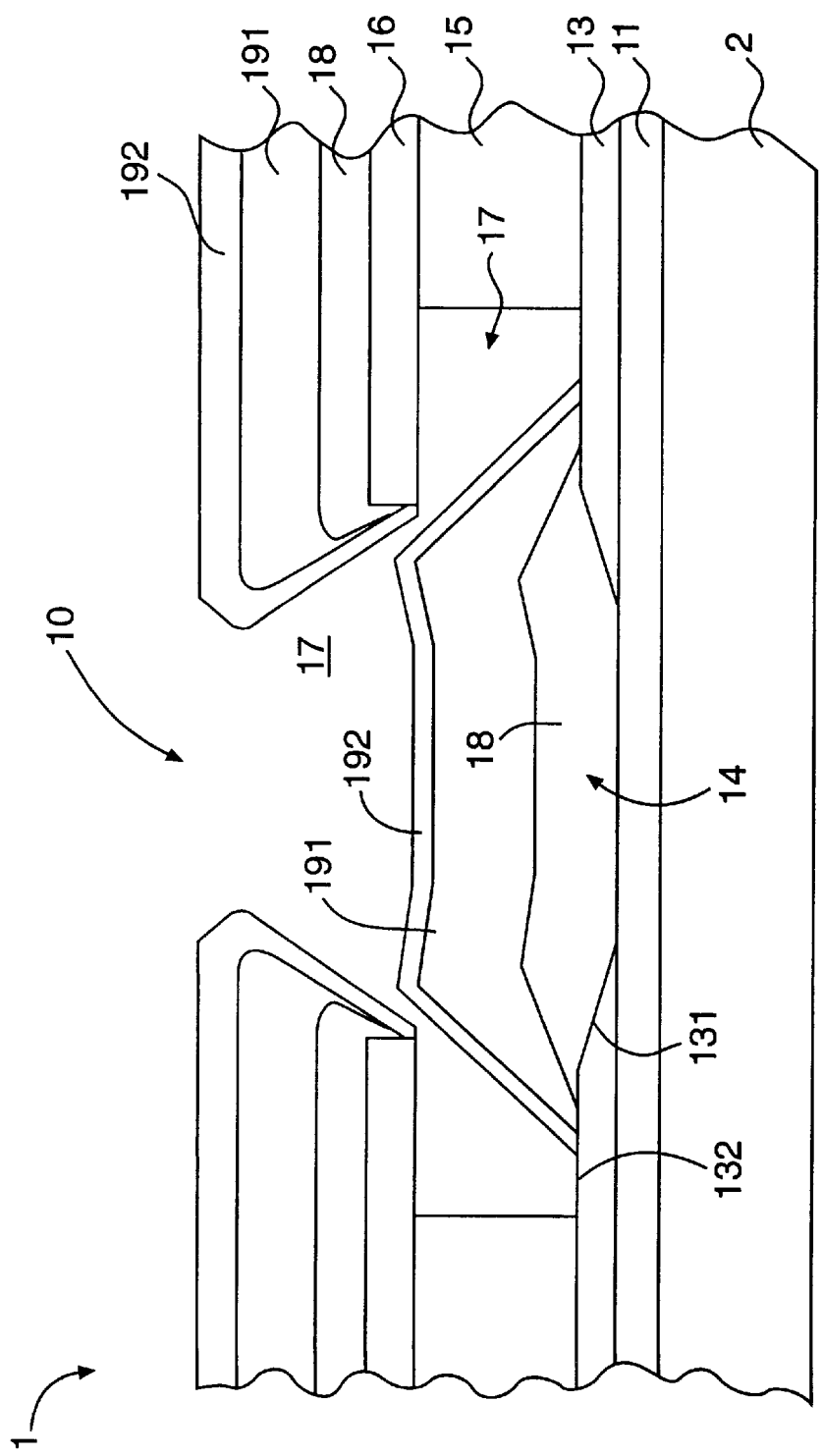
FIG. 5 is a side view of an organic light emitting device according to another embodiment of the present invention.
Figure 6:
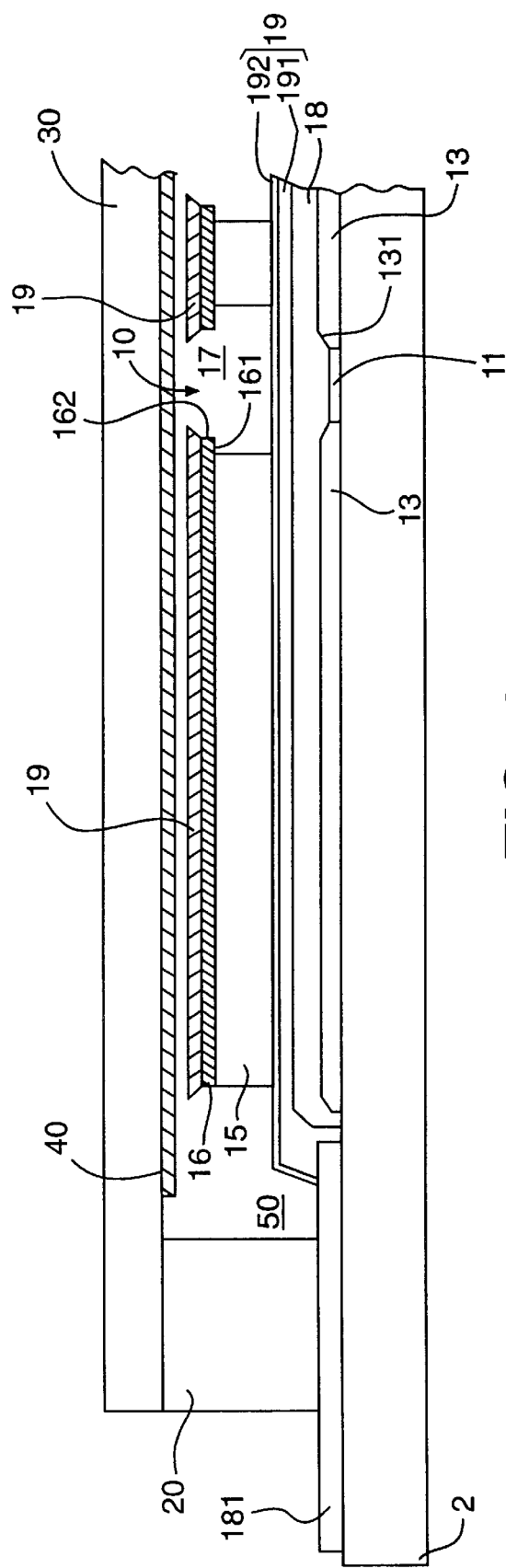
FIG. 6 is a side view illustrating the connection between the first passivation layer and an OLED connector pad according to the embodiment of FIG. 5.

The embodiment of FIG. 5 also including OLED connector pads 181 are deposited on the edge of the substrate 2, as shown in FIG. 6. The OLED connector pads 181 serve as electrical connectors for the first passivation layer 191. The first passivation layer 191 electrically connects the connector pads 181 to the OLED layer 18, as shown in FIG. 6. Similarly with this arrangement, electrical connections can be made without the need of additional structures and further processing after OLED formation.

A first insulator layer 13 is formed above the electrode elements 11. As described above in connection with the embodiment disclosed in FIG. 1, the first insulator layer 13 includes one or more pixel areas 14 formed therein. The pixel areas 14 are aligned on the electrode elements 11. As described above, the first insulator layer 13 provides barrier between the electrode elements 11 and the top electrode layer 182 of the OLED layer 18. A second insulator layer 15 is formed on top of the first insulator layer 13. As described above, the second insulator layer 15 is preferably formed from a differentially etchable material relative to the first insulator 13 and overlying layer 16. As described above, an overlying layer 16 is deposited on top of the second insulator layer 15. A portion of the overlying layer 16 is removed above the pixel area 14. A portion of the second insulator layer 15 is removed above the pixel area 14.

The OLED layer 18 comprising one or more layers is then deposited within the channel 17 covering the pixel area 14, as shown in FIG. 1. The OLED layer 18 extends up a portion of the uniformly sloping surfaces 131 and over a portion of a protective ledge 132. The top layer of the OLED layer 18 is preferably a transparent electrode layer.

A passivation layer 19 is then applied over the OLED layer 18 to provide a low pinhole density moisture barrier. The passivation layer 19 also electrically connects the OLED layer 18 to the connector pad 181. As described above, the passivation layer 19 minimizes the possibility of moisture penetration and subsequent separation of the layers. The passivation layer 19 preferably includes multiple layers. The first passivation layer 191 is deposited on top of the OLED layer 18 and extends over a portion of the protective ledge 132. The first passivation layer 191 is preferably an electrode formed from a metal (e.g., Mg and Ag alloys or Al and Cu and Ti alloys, DLC, graphite, ITO, SiC, PECVDC, etc.).

The second passivation layer 192 is deposited on top of the first passivation layer 191. The second passivation layer 192 is preferably formed from DLC films or PECVD deposited insulators such as $Si_3O_4$ and $SiO_2$. However, it is contemplated that the second passivation layer 191 is not limited to the specific materials disclosed. Rather, other electrically conducting materials having low pinhole densities are contemplated to be within the scope of the present invention.

Although a passivation layer 19 containing first and second passivation layers 191 and 192 is presently preferred by the inventors, it is contemplated that a single passivation layer may be used in accordance with the present invention. Additionally, it is also contemplated that more than two passivation layers may be used in accordance with the present invention. Additional passivation layers may be used to reduce pinhole density and defects.

Additionally, the passivation layers 191 and 192 extend over a portion of connector pads 182, as shown in FIG. 3. the passivation layers 121 and 122 provide a barrier to prevent moisture penetration between the connector pad 182 and the top electrode layer 182.

Figure 7A:
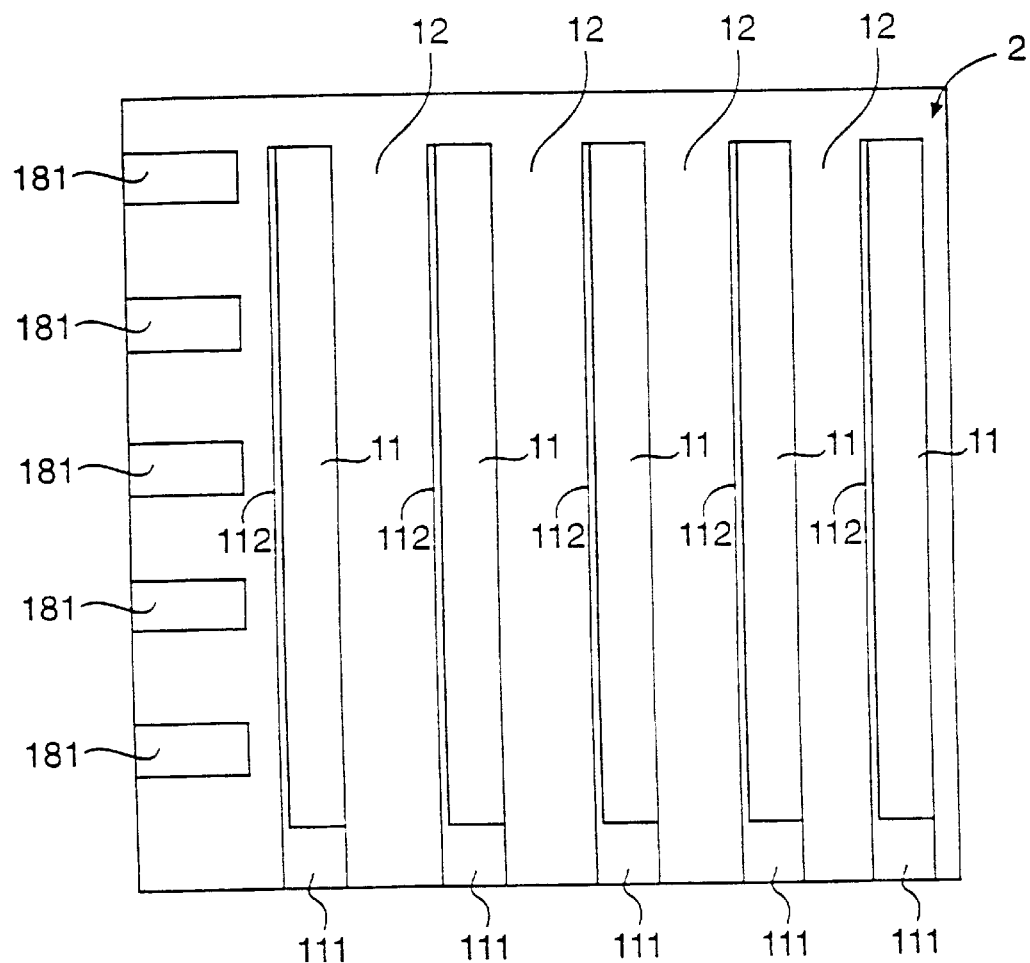
FIG. 7A is a top plan view of the substrate, first electrode elements and OLED connector pads according to another embodiment of the present invention.
Figure 7B:
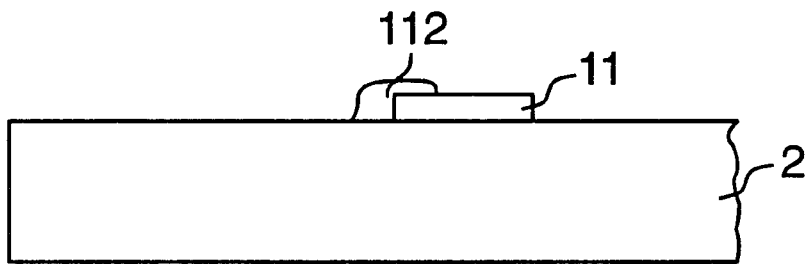
FIGS. 7B, 7C and 7D are side views of substrate and first electrode elements according to other embodiments of the present invention.
Figure 7C:
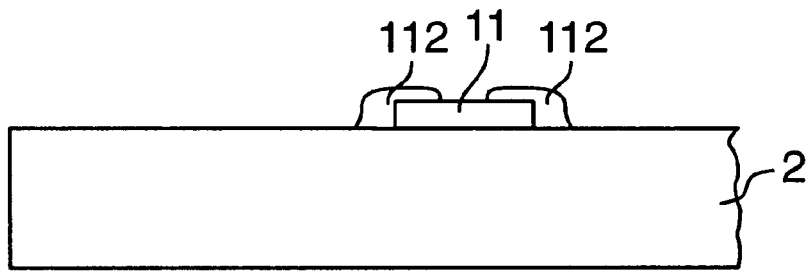
Figure 7D:
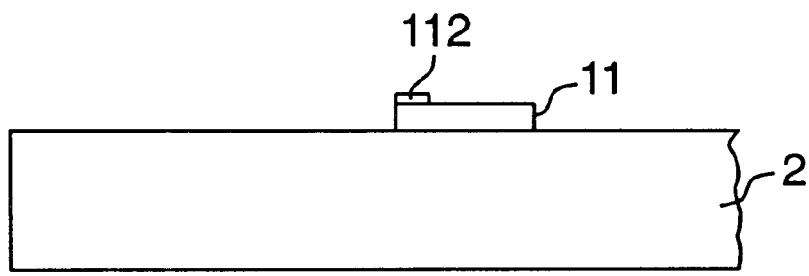

Another embodiment of the electrode elements 11 will now be described in connection with FIGS. 7A–7D. As described above, an electrode layer is formed on the substrate 2. The electrode layer includes a plurality of light transmissive electrode element 11. Each electrode element 11 includes an end portions 11 that forms an electrical connector for the electrode element. The end portions preferably formed from chrome. Additionally, the electrode element 11 may be strapped with a thick conductor to overcome the high resistance of the leads. This strapping of the element 11 increases conductivity. Each electrode element 11 may include conductor line 112 formed therein. The conductor line 112 is preferably formed from a material (e.g., chrome) that is more conductive than the electrode element 11. The conductor line 112 is positioned on an edge of the electrode element 11 to avoid decreases in illumination, as shown in FIG. 7A. The conductor line 112 may be strapped and extend along side of the element 11, as shown in FIGS. 7B and 7C. Alternatively, the conductor line 112 may be deposited directly on top of the element 11, as shown in FIG. 7D. The enhanced conductivity of the line 112 improves the transfer of electrical energy to the individual pixel area 14.

The conductor line 112 is preferably formed during deposition of the conductor pads 181 and the end portions 11. The conductor lines 112 permit formation of larger displays.

The OLED 1 is sealed, as shown in FIGS. 3 and 6, to prevent exposure to moisture and oxygen, which reduce the useful lifetime of the OLED. The OLED 1 is preferably sealed using a seal 20 and a sealing plate 30. The seal 20 and sealing plate 30 prevent exposure of the reactive materials that form the OLED 1 to moisture and oxygen. With this arrangement, only the electrode pads 111 and the OLED connector pads 181 extend outside the seal created by the seal 20 and sealing plate 30.

The seal 20 may be formed from a UV epoxy. However, other suitable sealing materials are contemplated to be within the scope of the present invention. The sealing plate 30 may be formed from glass or foil. A surface of the sealing plate 30 contains a thin film or layer 40 of a getter material. The getter material reacts with the moisture and oxygen that may be present within sealed OLED cavity 50. Various getter materials may be used as the getter material including but not limited to Ba, BaO, Li, Ca and other suitable materials that react with moisture and oxygen. The cavity 50 within the OLED 1 may be filled with an inert gas, such as, for example, argon. Alternatively, the OLED may be sealed under vacuum.

While the present invention has been described in terms of a downwardly emitting OLED, the present invention is limited to downwardly emitting OLEDs. Rather, upwardly or top emitting OLEDs are contemplated to be within the scope of the present invention. In such an arrangement, light is emitted through the substrate 2. As such, the substrate 2 should be formed from a transparent material. In this arrangement, the order of the layers is reversed. The electron injector metal layer is located on the bottom and the ITO layer is placed on top. The bottom electrode becomes a thin see-through electron injector. For example, a 100 Angstrom layer of Mg—Ag may be used. Additionally, electrode elements 11 must be formed from an electrically conductive transparent material. The passivation layer 191 may be formed from a reflective material to increase the upward transmission of light through the substrate 2. Alternatively, top electrode layer 182 may be formed from a dark conductor (e.g., a mixture of Au or C with under 50% SiO) to increase the upward transmission of light through the substrate 2.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

We claim:

1. An organic light emitting device comprising:
   a substrate;
   at least one conductor formed on said substrate;
   a first insulator layer formed on said at least one conductor and said substrate, wherein said insulator layer includes at least one pixel opening formed therein defining a pixel area, wherein said first insulator layer includes a uniformly sloping surface surrounding said pixel area;
   a second insulator layer formed on said first insulator layer; and
   an OLED layer formed on said at least one conductor in said pixel area wherein said OLED layer extends over said uniformly sloping surface of said first insulator layer.

2. The organic light emitting device according to claim 1, further comprising:
   a sealing assembly secured to said substrate for enclosing said first insulator layer, said second insulator layer, said OLED layer and a portion of said at least one conductor.

3. The organic light emitting device according to claim 2, wherein said sealing assembly includes a seals and a sealing plate.

4. The organic light emitting device according to claim 3, further comprising a getter material deposited on said sealing plate for absorbing moisture and oxygen.

5. The organic light emitting device according to claim 1, further comprising:
   a sealing structure formed over said OLED layer.

6. The organic light emitting device according to claim 5, wherein said sealing structure includes at least one material formed over said OLED layer.

7. The organic light emitting device according to claim 6, further comprising:
   a sealing assembly secured to said substrate for enclosing said first insulator layer, said second insulator layer, said OLED layer and a portion of said at least one conductor.

8. The organic light emitting device according to claim 7, wherein said sealing assembly includes a seals and a sealing plate.

9. The organic light emitting device according to claim 8, further comprising a getter material deposited on said sealing plate for absorbing moisture and oxygen.

10. The organic light emitting device according to claim 5, wherein said first insulator layer, said at least one conductor, and said sealing structure form a protective barrier around said OLED layer.

11. The organic light emitting device according to claim 6, wherein said sealing structure includes two layers formed over said OLED layer.

12. The organic light emitting device according to claim 1, further comprising at least one OLED connector pad formed on said substrate, said at least one OLED connector pad is capable of being electrically connected to said OLED layer.

13. The organic light emitting device according to claim 12, wherein said at least one OLED connector pad is orthogonal to the at least one conductor.

14. The organic light emitting device according to claim 12, wherein said OLED layer comprises at least one layer, and one of said at least one layer is electrically connected to one of said at least one OLED connector pad.

15. The organic light emitting device according to claim 14, further comprising:

a sealing structure formed over said OLED layer.

16. The organic light emitting device according to claim 15, further comprising:
a sealing structure formed over said OLED layer, wherein said sealing structure electrically connects said OLED layer to one of said at least one conductor pad.

17. The organic light emitting device according to claim 12, further comprising:
a sealing assembly secured to said substrate for enclosing said first insulator layer, said second insulator layer, said OLED layer, a portion of said at least one conductor, and a portion of said at least one OLED connector pad.

18. The organic light emitting device according to claim 17, wherein said sealing assembly includes a seals and a sealing plate.

19. The organic light emitting device according to claim 18, further comprising a getter material deposited on said sealing plate for absorbing moisture and oxygen.

20. The organic light emitting device according to claim 1, further comprising a conductor line formed on each of said at least one conductor.

21. The organic light emitting device according to claim 20, wherein said conductor line is positioned along an edge of each of said at least one conductor.

22. The organic light emitting device according to claim 21, wherein said conductor line is formed from a material having greater electrical conductivity than the material forming said at least one conductor.

23. The organic light emitting device according to claim 1, further comprising a high conductive material formed on a portion of each of said at least one conductor to increase the conductivity of said at least one conductor.

24. An organic light emitting device comprising:
a substrate;
at least one conductor formed on said substrate;
at least one OLED connector pad formed on said substrate;
a first insulator layer formed on said at least one conductor and said substrate, wherein said insulator layer includes at least one pixel opening formed therein defining a pixel area, wherein said first insulator layer includes a uniformly sloping surface surrounding said pixel area; and
an OLED layer formed on said at least one conductor in said pixel area, wherein said at least one OLED connector pad is capable of being electrically connected to said OLED layer, wherein said OLED layer extends over said uniformly sloping surface.

25. The organic light emitting device according to claim 24, further comprising:
a sealing assembly secured to said substrate for enclosing said insulator layer, said OLED layer, a portion of said at least one conductor, and a portion of said at least one OLED connector pad.

26. The organic light emitting device according to claim 25, wherein said sealing assembly includes a seals and a sealing plate.

27. The organic light emitting device according to claim 26, further comprising a getter material deposited on said sealing plate for absorbing moisture and oxygen.

28. The organic light emitting device according to claim 24, further comprising a conductor line formed on each of said at least one conductor.

29. The organic light emitting device according to claim 28, wherein said conductor line is positioned along an edge of each of said at least one conductor.

30. The organic light emitting device according to claim 29, wherein said conductor line is formed from a material having greater electrical conductivity than the material forming said at least one conductor.

31. The organic light emitting device according to claim 27, further comprising:
a second insulator layer formed on said first insulator layer.

32. The organic light emitting device according to claim 31, further comprising:
a sealing structure formed over said OLED layer.

33. The organic light emitting device according to claim 32, wherein said sealing structure includes at least one material formed over said OLED layer.

34. The organic light emitting device according to claim 24, further comprising:
a sealing structure formed over said OLED layer.

35. The organic light emitting device according to claim 34, wherein said first insulator layer and said sealing structure form a protective barrier around said OLED layer.

36. The organic light emitting device according to claim 35, wherein said sealing structure includes at least one material formed over said OLED layer.

37. The organic light emitting device according to claim 36, wherein said sealing structure includes two layers formed over said OLED layer.

38. The organic light emitting device according to claim 37, wherein one of said two layers of said sealing structure electrically connects one of said at least one OLED conductor pad to said OLED layer.

* * * * *